(12) United States Patent
Godycki

(10) Patent No.: US 10,084,448 B2
(45) Date of Patent: Sep. 25, 2018

(54) DRIVER INTERFACE METHODS AND APPARATUS FOR SWITCH-MODE POWER CONVERTERS, SWITCH-MODE POWER AMPLIFIERS, AND OTHER SWITCH-BASED CIRCUITS

(71) Applicant: Eridan Communications, Inc., San Francisco, CA (US)

(72) Inventor: Waclaw Godycki, Portland (PL)

(73) Assignee: Eridan Communications, Inc., Santa Clara, CA (US)

( * ) Notice: Subject to any disclaimer, the term of this patent is extended or adjusted under 35 U.S.C. 154(b) by 0 days.

(21) Appl. No.: 15/176,487

(22) Filed: Jun. 8, 2016

(65) Prior Publication Data

US 2017/0359060 A1    Dec. 14, 2017

(51) Int. Cl.
| | |
|---|---|
| *H03K 17/687* | (2006.01) |
| *H03K 5/08* | (2006.01) |
| *H03K 17/74* | (2006.01) |
| *H03K 17/691* | (2006.01) |
| *H01L 29/778* | (2006.01) |
| *H01L 29/20* | (2006.01) |
| *H03F 3/217* | (2006.01) |
| *H03F 3/193* | (2006.01) |
| *H02M 3/158* | (2006.01) |

(52) U.S. Cl.
CPC ..... *H03K 17/6871* (2013.01); *H01L 29/2003* (2013.01); *H01L 29/778* (2013.01); *H02M 3/158* (2013.01); *H03F 3/193* (2013.01); *H03F 3/2173* (2013.01); *H03K 5/08* (2013.01); *H03K 17/691* (2013.01); *H03K 17/74* (2013.01); *H03F 2200/171* (2013.01); *H03F 2200/331* (2013.01); *H03F 2200/351* (2013.01); *H03F 2200/451* (2013.01)

(58) Field of Classification Search
CPC ............. H03K 17/063; H03K 17/0822; H03K 17/04123; H03K 2217/0036; H03K 17/687
USPC ................................. 327/108–110, 427, 434
See application file for complete search history.

(56) References Cited

U.S. PATENT DOCUMENTS

| | | | |
|---|---|---|---|
| 6,028,574 A * | 2/2000 | Bancal | G09G 3/22 345/75.1 |
| 6,211,706 B1 * | 4/2001 | Choi | H03K 17/063 327/108 |

(Continued)

*Primary Examiner* — Quan Tra
(74) *Attorney, Agent, or Firm* — Patent Law Professionals, P.C.; William E. Winters

(57) ABSTRACT

A driver interface for a switch-based circuit includes an AC coupling capacitor, a first diode or a first series of diodes, and a second diode or a second series of diodes connected in series with the first diode or first series of diodes but with an opposing polarity. The AC coupling capacitor removes a DC voltage from an input bi-level drive signal that does not have the appropriate high and low drive levels needed to switch a FET in the switch-based circuit between fully ON and fully OFF states. The first diode or first series of diodes and the second diode or second series of diodes clamp the resulting AC-coupled drive signal to produce an output bi-level drive signal having the high and low drive levels needed to switch the FET between fully ON and fully OFF states. The driver interface maintains the high and low drive levels of the output bi-level drive signal irrespective of any changes made to the duty cycle or pulse density of the input bi-level drive signal.

5 Claims, 14 Drawing Sheets

(56) References Cited

U.S. PATENT DOCUMENTS

| | | | | |
|---|---|---|---|---|
| 8,476,885 B2 * | 7/2013 | Briere | ............. | H01L 27/0211 323/222 |
| 8,487,664 B2 * | 7/2013 | Draxelmayr | ............. | H02M 1/08 327/108 |
| 8,558,586 B1 * | 10/2013 | Martin | ............. | G11C 7/1057 327/108 |
| 8,581,638 B2 * | 11/2013 | Chen | ............. | H03K 17/063 327/108 |
| 2003/0042967 A1 * | 3/2003 | Middel | ............. | H03K 17/6871 327/424 |
| 2003/0214768 A1 * | 11/2003 | Lin | ............. | H01L 27/0274 361/56 |
| 2005/0111153 A1 * | 5/2005 | Kitagawa | ............. | H01L 27/0266 361/91.1 |
| 2005/0269631 A1 * | 12/2005 | Ryoo | ............. | H03K 17/6872 257/335 |
| 2008/0111611 A1 * | 5/2008 | Thiele | ............. | H03K 17/04123 327/427 |
| 2009/0033405 A1 * | 2/2009 | Yanagishima | ............. | H02M 1/08 327/427 |
| 2009/0115487 A1 * | 5/2009 | Taddiken | ............. | H03K 19/018521 327/333 |
| 2013/0127544 A1 * | 5/2013 | Murakami | ............. | H03F 1/02 330/296 |
| 2014/0292408 A1 * | 10/2014 | Baumgartner | ............. | H03F 3/2171 330/251 |

\* cited by examiner

GaN-HEMT
w/ drain-source
shorted

Schottky
Diode

Half-Bridge of
Synchronous Power
Converter
or
Output Switching
Stage of
Switch-Mode
Amplifier

DRIVER INTERFACE METHODS AND APPARATUS FOR SWITCH-MODE POWER CONVERTERS, SWITCH-MODE POWER AMPLIFIERS, AND OTHER SWITCH-BASED CIRCUITS

RESEARCH OR DEVELOPMENT

This invention was made with Government support under Contract No. FA8750-14-C-0099 awarded by the Air Force Research Laboratory on behalf of DARPA. The Government has certain rights in the invention.

BACKGROUND OF THE INVENTION

Various electrical circuits—such as switch-mode power converters and switch-mode power amplifiers—employ transistors that are controlled to operate as switches. The transistors employed in these "switch-based" circuits are often power field-effect transistors (FETs) that are switched ON and OFF under the control of a square wave or some other bi-level drive signal. To minimize switching losses and maximize energy efficiency as the power FETs are switched ON and OFF it is desirable to minimize the times it takes for the power FETs to transition between ON and OFF states. Unfortunately, power FETs have large input gate capacitors that must be charged in order to switch them from OFF to ON states but the drive signals, which are often generated by a logic circuit or other circuit, such as a microcontroller, often lack the current supplying capability necessary to rapidly charge the large input gate capacitors. To overcome this problem a gate driver is usually employed. As illustrated in FIG. 1, by using the gate driver 102 the large drive currents needed to rapidly charge the input gate capacitors of the power FETs is made possible and switching losses are thereby minimized.

Although a gate driver can help to minimize switching losses, it will not necessarily produce a drive signal $V_{drive}$ that is capable of switching the power FETs in the switch-based circuit between fully ON and fully OFF states. Switching the power FETs between fully ON and fully OFF states is important since it reduces I-R losses during times when the power FETs in the switch-based circuit 104 is conducting (ON) or blocking (OFF) current. A power FET will be turned fully ON when it is forced to operate in its linear region of operation (or "ohmic" region), where its ON resistance (drain-source resistance $R_{DS}(ON)$) is very low, and will be turned fully OFF when it is forced to operate in its cut-off region of operation, where its OFF resistance is very high. In the case of an n-channel, enhancement mode power FET (e.g., a silicon, n-channel, enhancement mode metal-oxide-semiconductor FET (Si-MOSFET)), the power FET will be forced to operate in its cut-off region if the drive voltage applied to its gate $V_G$ is lower than the voltage applied to its source $V_S$ by at least the power FET's threshold voltage $V_T$ (i.e., if $V_G-V_S=V_{GS}<V_T$), and will be forced to operate in its linear region if the drive voltage applied to its gate $V_G$ is higher than the voltage applied to its drain $V_D$ by at least one threshold voltage $V_T$ and higher than the voltage applied to its source $V_S$ by at least one threshold voltage $V_T$, in other words, if: $V_G-V_S>V_T$ and $V_G-V_D>V_T$. Unfortunately, the high and low drive levels $V_H$ and $V_L$ of the drive signal $V_{drive}$ produced by the gate driver 102 are not always of the proper levels necessary to satisfy these requirements. This problem is highlighted in the signal diagram shown in FIG. 2, where it is seen that the high and low drive levels $V_H$ and $V_L$ of the drive signal $V_{drive}$ produced by the gate driver 102 in FIG. 1 are both higher than the acceptable input high-level and acceptable input low-level ranges of the power FET of the switch-based circuit 104 being driven. This incompatibility is unacceptable since it renders the gate driver 102 incapable of switching the power FET fully ON and fully OFF, as desired.

The incompatibility of the high and low drive levels $V_H$ and $V_L$ of the gate drive signal $V_{drive}$ at driving the power FET in the switch-based circuit 104 between fully ON and fully OFF states can be overcome in some situations by level shifting the drive signal $V_{drive}$. The simplest approach to level shifting the drive signal $V_{drive}$ is to pass the drive signal $V_{drive}$ through a DC blocking capacitor 302, as illustrated in FIG. 3, and then to bias the resulting AC signal by a DC bias voltage $V_{BIAS}$ using a resistor 304. So long as the level-to-level voltage swing of the drive signal $V_{drive}$ is within certain limits, the high and low drive levels $V_H$ and $V_L$ of the resulting level-shifted drive signal $V_{drive}'$ can be made to fall within the acceptable input high-level and acceptable low-level input ranges of the switch-based circuit being driven, as illustrated in FIG. 4.

The level-shifting approach in FIG. 3 is a suitable solution for many applications. However, it is not an acceptable solution in situations where the duty cycle of the drive signal $V_{drive}$ varies over time. This limitation deserves serious consideration since many types of switch-based circuits are driven by pulse-width modulation (PWM) signals, which have waveforms with time-varying duty cycles. For example, in a synchronous buck converter, which is an example of one type of switch-mode power converter, PWM signals are used to drive the high-side and low-side power FETs of the converter's half-bridge and the duty cycles of the PWM signals are varied to regulate power delivery to a load. Similarly, in a Class-D power amplifier which is an example of one type of switch-mode power amplifier, PWM signals are used to drive the high-side and low-side FETs of the amplifier's switching stage and the duty cycles of the PWM signals are modulated to encode and convey information (e.g., voice or data). If the conventional level-shifting approach depicted in FIG. 3 was to be used to level shift an input PWM signal $V_{drive}$ in these PWM applications, the resulting level-shifted PWM drive signal $V_{drive}'$ would end up appearing similar to that shown in FIG. 6, where it is seen that the extent to which the level-shifted PWM drive signal $V_{drive}'$ has been shifted depends on the duty cycle of the input PWM waveform $V_{IN}$ (compare FIGS. 5 and 6). This dependency follows from the fact that the DC component of the input PWM waveform $V_{IN}$ is higher the higher the duty cycle is (see FIG. 7). Employing the level-shifting approach in FIG. 3 to level-shift PWM signals would consequently result in the level-shifted drive signal $V_{drive}'$ having high and low drive levels $V_H$ and $V_L$ that vary over time depending on the duty cycle D of the input switching signal $V_{IN}$. This effect can be seen in the timing diagrams in FIGS. 5 and 6. Specifically, as the duty cycle D of the input switching signal $V_{IN}$ increases from 50% to 75% (see FIG. 5), the high and low drive levels $V_H$ and $V_L$ of the level-shifted PWM drive signal $V_{drive}'$ both reduce in value from $V_{H,1}$ and $V_{L,1}$ to $V_{H,2}$ and $V_{L,2}$ (see FIG. 6), and as the duty cycle D of the input switching signal $V_{IN}$ subsequently decreases from 75% to 25%, the high and low drive levels both increase in value from $V_{H,2}$ and $V_{L,2}$ to $V_{H,3}$ and $V_{L,3}$. This dependency of the high and low drive levels $V_H$ and $V_L$ on the duty cycle D of the input PWM drive signal $V_{IN}$ is highly undesirable since, as can also be seen in FIG. 6, it can result in the high and low drive levels $V_H$ and $V_L$ not always falling within the acceptable input high-level and acceptable input low-level ranges of the switch-based circuit being driven. The only way to avoid this problem when the level-shifting approach depicted in FIG. 3 is being used is to severely constrain the extent to which the duty cycle D of the input switching signal $V_{IN}$ can vary.

Considering the drawbacks and limitations of conventional level-shifting approaches, it would be desirable to have level-shifting methods and apparatus that are not only capable of level shifting an input PWM gate drive signal but which are also capable of maintaining the high and low drive levels of the level-shifted PWM gate drive signal at fixed voltages, irrespective of changes made to the duty cycle of the input PWM gate drive signal.

BRIEF SUMMARY OF THE INVENTION

Methods and apparatus for interfacing gate drivers to switch-based circuits are disclosed. An exemplary driver interface includes an AC coupling capacitor, a first diode or a first series of diodes, and a second diode or a second series of diodes connected in series with the first diode or first series of diodes but with an opposing polarity. The AC coupling capacitor serves to remove a DC voltage from an input bi-level drive signal that does not have the appropriate high and low drive levels necessary to switch a field-effect transistor (FET) in the switch-based circuit between fully ON and fully OFF states. The first diode or first series of diodes and the second diode or second series of diodes clamp the resulting AC-coupled bi-level drive signal to produce an output bi-level drive signal that does have high and low drive levels capable of switching the FET between fully ON and fully OFF states. The driver interface maintains the high and low drive levels and DC operating point of the output bi-level drive signal at fixed levels irrespective of changes made to the duty cycle or pulse density of the input bi-level drive signal, thus making the driver interface well-suited for switch-mode power converters, switch-mode power amplifiers, and other switch-based circuits in which pulse-width modulation (PWM) or pulse-density modulation (PDM) drive signals are involved.

Further features and advantages of the invention, including a detailed description of the above-summarized and other exemplary embodiments of the invention, will now be described in detail with respect to the accompanying drawings, in which like reference numbers are used to indicate identical or functionally similar elements.

DETAILED DESCRIPTION

Figure 8:
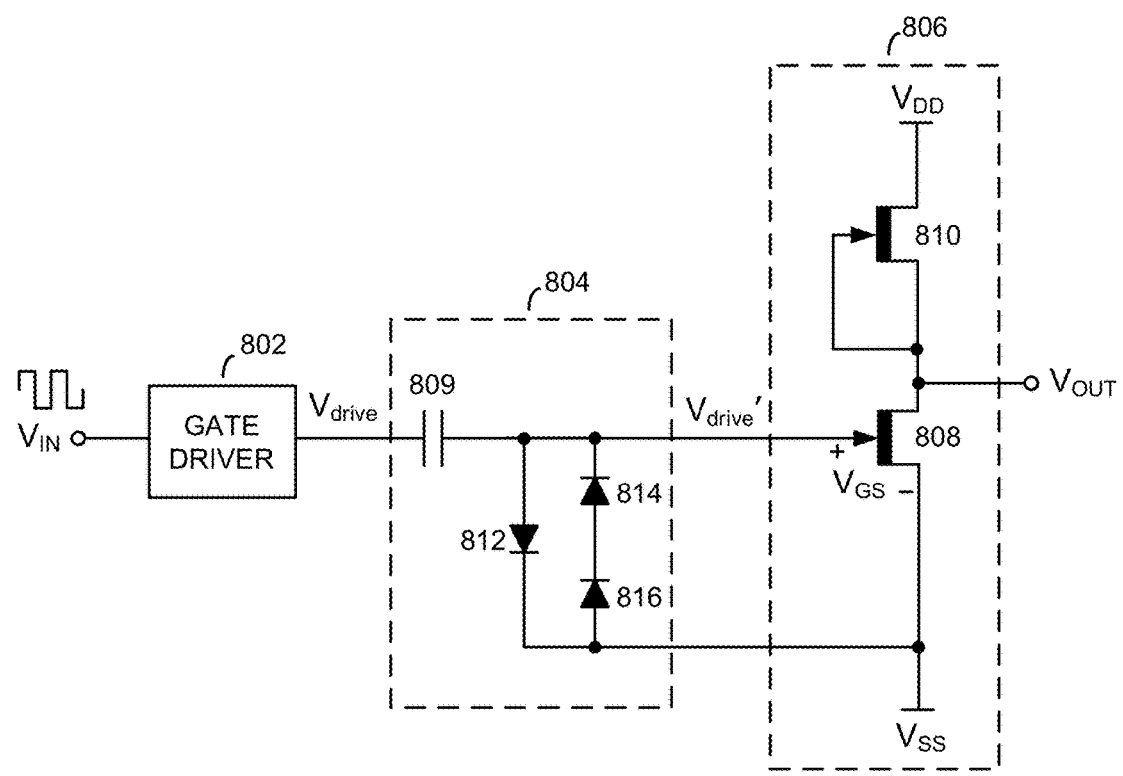
FIG. 8 is a schematic drawing of a circuit that employs a driver interface between the output of a gate driver and an input of a switch-based circuit, in accordance with one embodiment of the invention.

Referring to FIG. 8, there is shown a schematic drawing of a circuit that employs a driver interface 804 between the output of a gate driver 802 and an input of a switch-based circuit 806, in accordance with one embodiment of the invention. As will be described in detail in the detailed description that follows, the driver interface 804 serves two principal functions. First, it level shifts an input bi-level gate drive signal $V_{drive}$ provided by the gate driver 802 so that the high and low levels $V_H$ and $V_L$ of the resulting level-shifted bi-level gate drive signal $V_{drive}'$ always fall within the acceptable input high-level and input low-level ranges of the switch-based circuit 806. Second, it serves to maintain the high and low drive levels $V_H$ and $V_L$ of the level-shifted gate drive signal $V_{drive}'$ at fixed voltages irrespective of any variations that may be made to the duty cycle of the input switching signal $V_{IN}$. In the exemplary embodiment of the invention depicted in FIG. 8, the switch-based circuit 806 to which the driver interface 804 serves as an interface comprises an inverter (or a switching amplifier, depending on its application). It should be emphasized, however, that the driver interface 804 can be used as an interface to essentially any switch-based circuit that contains one or more FETs that is/are driven between fully ON and fully OFF states. For example, as will be discussed later in this detailed description, two driver interfaces similar in construction to the driver interface 804 depicted in FIG. 8 can be used to construct a driver interface stage for the high-side and low-side switches of a half-bridge of a synchronous buck converter or the high-side and low-side switches of the switching stage of a Class-S or Class-D amplifier.

Before continuing, it should also be pointed out that the switch 808 (i.e., FET 808) used in the switch-based circuit 806 in FIG. 8 is depicted using the transistor symbol commonly used to depict an n-channel, depletion mode metal-semiconductor field-effect transistor (MESFET). This depiction follows from the fact that in various preferred embodiments of the invention each of the FETs used in the switch-based circuits is a gallium nitride high electron mobility transistors (GaN-HEMT), which is a type of n-channel MESFET and which in its natural form is a depletion mode device. Although depletion mode GaN-HEMTs are preferred in the various exemplary embodiments of the invention described herein, those of ordinary skill in the art will appreciate and understand with the benefit of this disclosure that the interfacing methods and apparatus of the invention are not limited to interfacing to switch-based circuits made from GaN-HEMTs. In fact, they can be modified or adapted for use as interfaces to switch-based circuits constructed from essentially any transistor technology, including, for example, GaN-HEMTs that have been modified from their natural form (for example, using p-type gate doping, a recessed gate, fluorine plasma treatment, etc.) to operate as enhancement mode devices.

Figure 1:
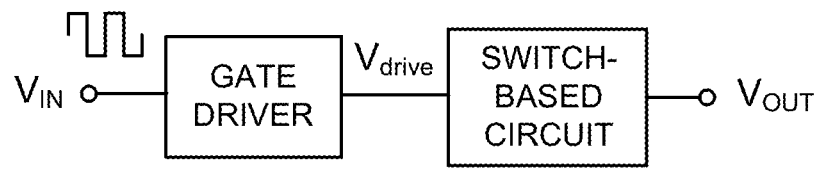
FIG. 1 is a drawing of a switch-based circuit that is being driven by a gate driver.
Figure 2:
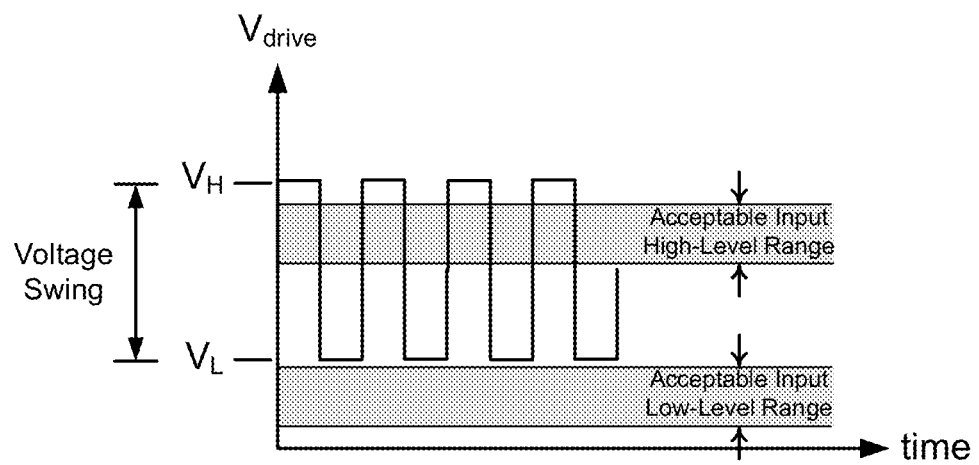
FIG. 2 is a signal diagram of a gate drive signal having high and low drive levels $V_H$ and $V_L$ that fail to fall within the acceptable input high-level and input low-level ranges of a switch-based circuit.
Figure 3:
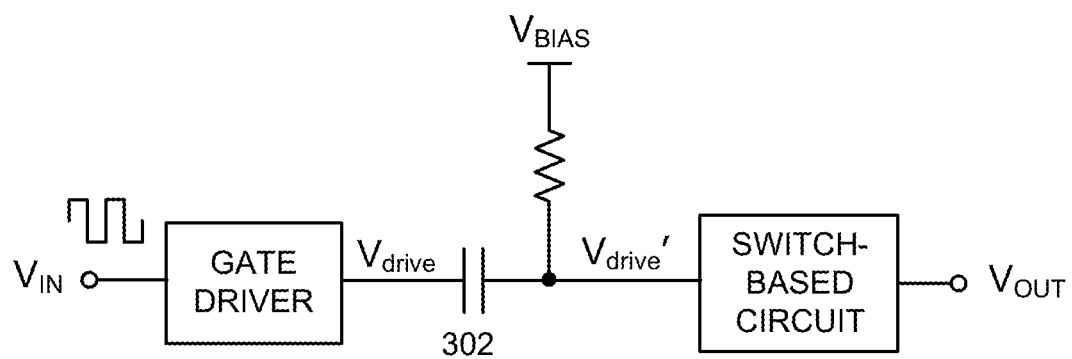
FIG. 3 is a drawing showing one prior art approach to level shifting a gate drive signal.
Figure 4:
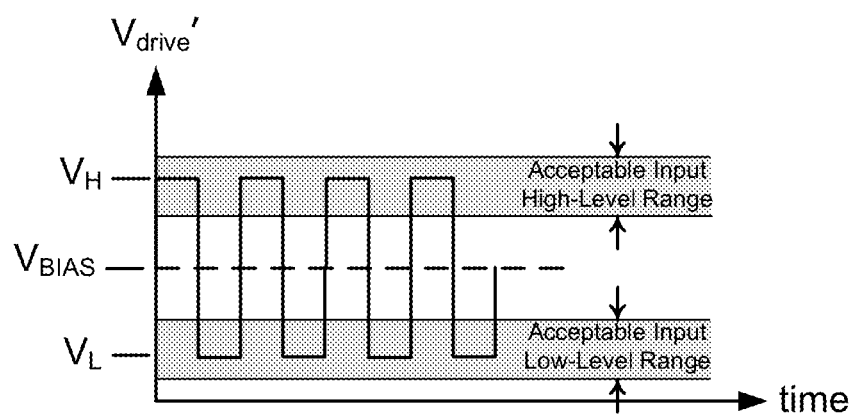
FIG. 4 is a signal diagram that illustrates how the conventional level-shifting approach depicted in FIG. 3 can be used to successfully level shift an input drive signal in applications where the input drive signal has a constant (i.e., non-time-varying) duty cycle.
Figure 5:
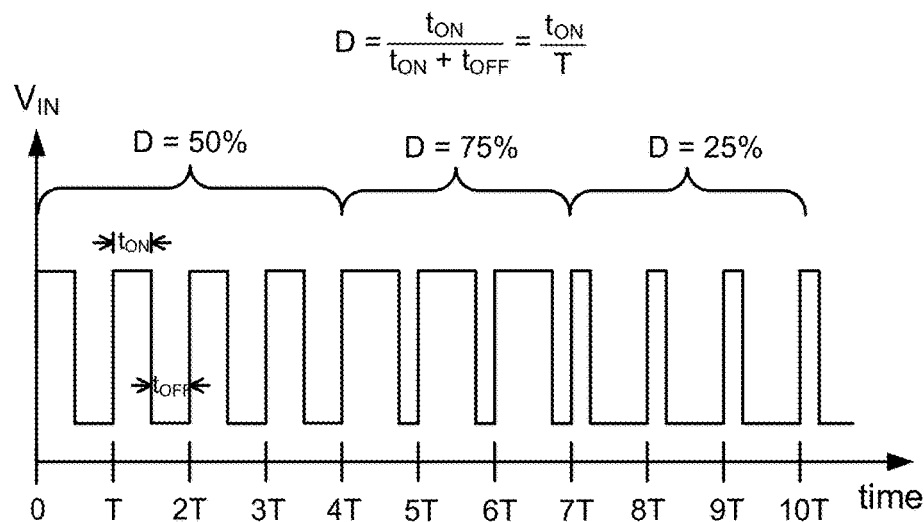
FIG. 5 is signal diagram of a pulse-width modulated (PWM) drive signal, highlighting how the duty cycle of the PWM drive signal varies over time.
Figure 9A:
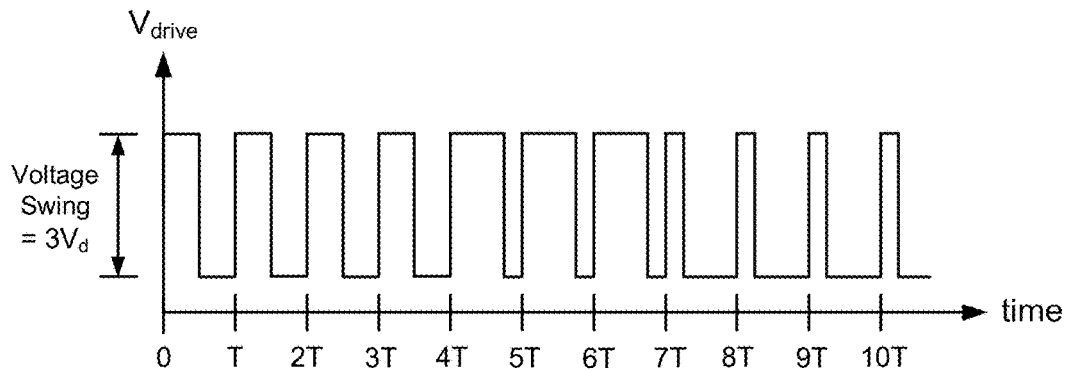
FIG. 9A is a signal diagram of the PWM drive signal $V_{drive}$ produced by the gate driver in the circuit depicted in FIG. 8.
Figure 9B:
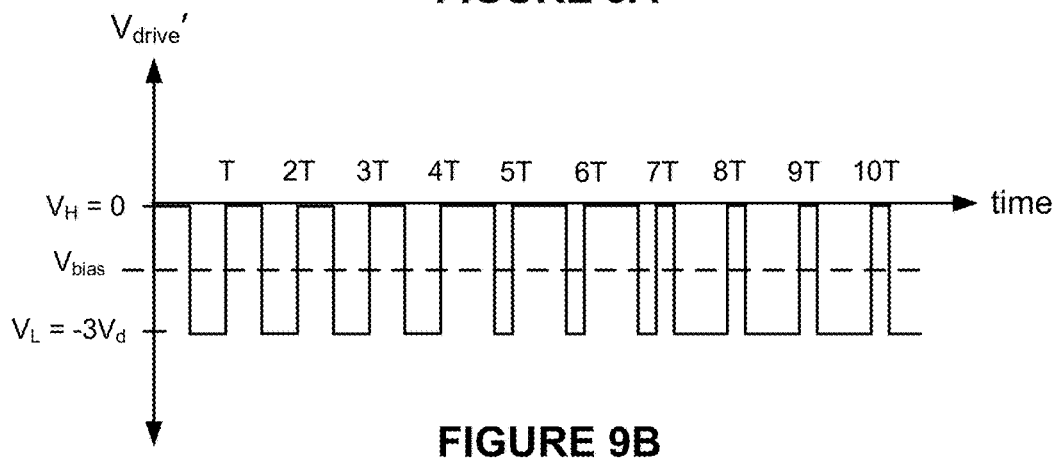
FIG. 9B is signal diagram of the level-shifted PWM drive signal $V_{drive}'$ produced at the output of the driver interface in the circuit depicted in FIG. 8, highlighting how the high and low drive levels $V_H$ and $V_L$ of the level-shifted PWM signal $V_{drive}'$ and its effective bias voltage bias voltage $V_{BIAS}$ are maintained at fixed levels irrespective of the duty cycle of the PWM drive signal $V_{drive}$ provided by the gate driver.
Figure 9C:
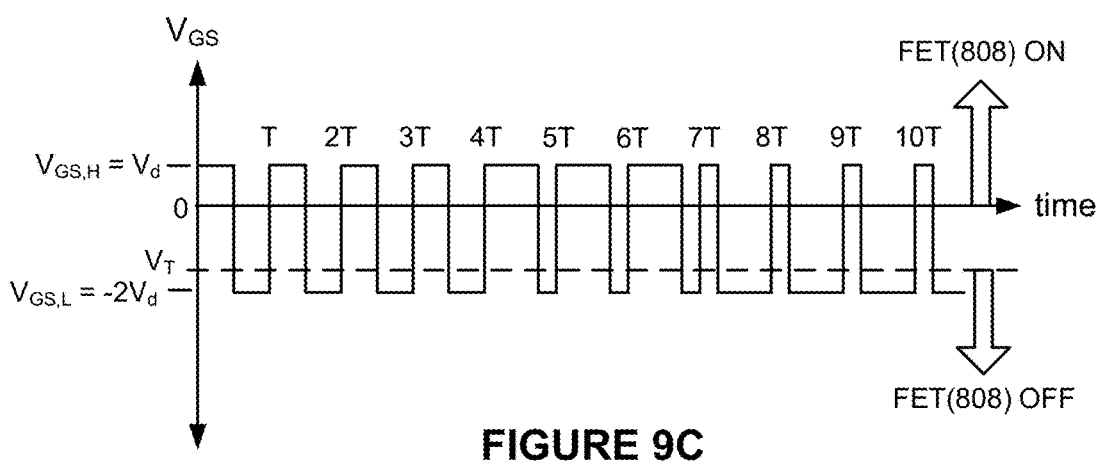
FIG. 9C is a signal diagram of the gate-source voltage waveform $V_{GS}$ applied across the gate-source terminals of the switching FET in the switch-based circuit in FIG. 8, highlighting how the driver interface operates to maintain the high and low gate-source drive levels $V_{GS,H}$ and $V_{GS,L}$ of the gate-source voltage waveform $V_{GS}$ at constant levels, irrespective of the duty cycle of the PWM drive signal $V_{drive}$ provided by the gate driver.

Depletion mode FETs have a negative threshold voltage $V_T$. Consequently, the FET 808 in the exemplary switch-based circuit 806 will be switched OFF when $V_{GS}(808) < V_T$ and will be switched ON when $V_{GS}(808) > 0V$. The DC blocking capacitor 809 and clamping diodes 812, 814 and 816 of the driver interface 804 operate to ensure that these requirements are satisfied. In the exemplary embodiment described here, the FETs 808 and 810 are n-channel depletion mode GaN-HEMTs having a threshold voltage of $V_T \approx -1.8V$, the clamping diodes 812, 814 and 816 have a forward voltage drop of $V_d \approx 1V$, and the source supply voltage $V_{SS}$ is set to $V_{SS} = -V_d$. With these parameters, and for a gate drive signal $V_{drive}$ having a level-to-level voltage swing of $3V_d$, the driver interface 804 produces a level-shifted gate drive signal $V_{drive}'$ having a high drive level of $V_H = 0V$, a low drive level of $V_L = -3V_d$, and an effective DC bias voltage of $V_{BIAS} = -1.5V_d$ (see FIGS. 9A and 9B). The high and low drive levels $V_H$ and $V_L$ of the level-shifted drive signal $V_{drive}'$, as well as the high and low gate-source voltage levels $V_{GS,H}$ and $V_{GS,L}$ of the gate-source signal $V_{Gs}$ applied across the gate-source terminals of the switching FET 808 in the switch-based circuit 806 (see FIG. 9C), will remain fixed and independent of the duty cycle of the input drive signal so long as the level-to-level swing of $V_{bias}$ is remains greater than $3V_d$. The approach to biasing and driving the FET 808 of the switch-based circuit (inverter) 806 of the present invention is therefore superior to the conventional level-shifting approach described above in reference to FIG. 3 (compare FIG. 9B to FIG. 5).

Figure 10:
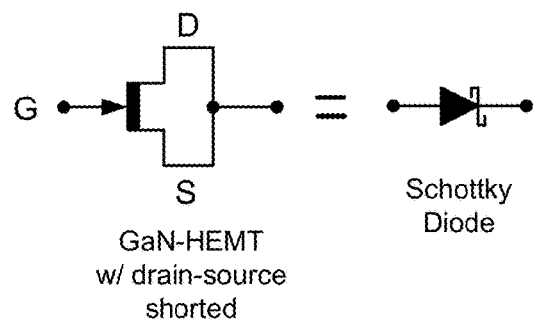
FIG. 10 is a drawing that illustrates how the Schottky barrier present at the gate input of a gallium nitride high electron mobility transistor (GaN-HEMT) can be used to form a Schottky diode, by shorting the GaN-HEMT's drain to its source.
Figure 11:
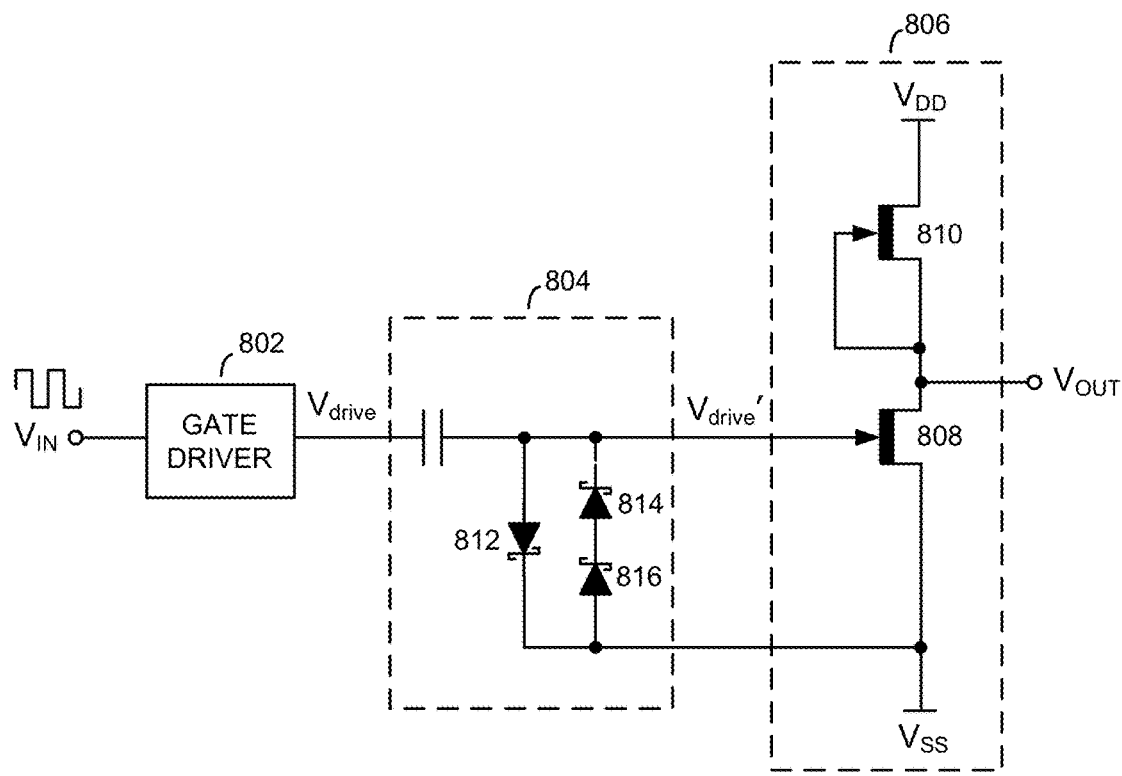
FIG. 11 is a schematic drawing of a circuit similar to that presented in FIG. 8, emphasizing how in one embodiment of the invention the diodes of the driver interface are implemented using GaN-HEMT Schottky diodes like that depicted in FIG. 10.

The actual forward voltage $V_d$ dropped by the clamping diodes 812, 814 and 816 when forward biased into conduction will depend on the materials from which they are made. In one embodiment of the invention the driver interface 804 and switch-based circuit 806 are both manufactured in the same GaN-HEMT integrated circuit, with the FETs 808 and 810 of the switch-based circuit 806 manufactured as GaN-HEMTs and each of the clamping diodes 812, 814 and 816 formed during fabrication by shorting the source of a GaN-HEMT to its drain. Note that the metal-semiconductor junction present at the gate input of the GaN-HEMT is a Schottky barrier. Accordingly, by shorting the GaN-HEMT's source to its drain during fabrication results in the formation of a Schottky diode, as illustrated in FIG. 10. To emphasize that in one embodiment of the invention the clamping diodes 812, 814 and 816 of the driver interface 804 are manufactured using the Schottky barriers of GaN-HEMTs in a GaN-HEMT manufacturing process, the circuit in FIG. 8 is reproduced in FIG. 11 but with the conventional symbol for a Schottky diode used to represent that the clamping diodes 812, 814 and 816 are Schottky diodes.

Figure 12:
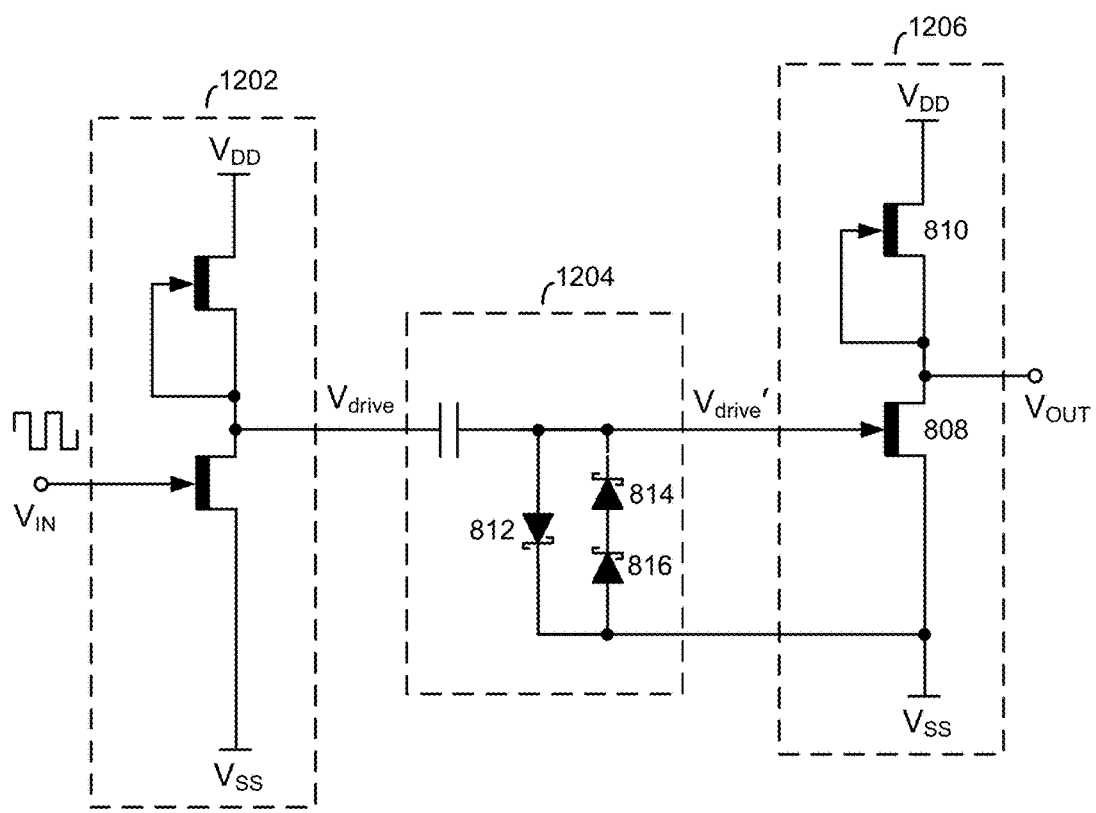
FIG. 12 is a schematic drawing that illustrates how a driver interface similar to the driver interface in FIG. 8 may be used as an interface between two switch-based circuits, each of which has an input voltage range different from its output voltage range.

Because depletion mode GaN-HEMTs have a negative threshold voltage $V_T$, the input voltage range of a GaN-HEMT switch-based circuit does not normally coincide with its output voltage range. For example, the switch-based inverter 806 in the circuit in FIG. 8 has an input range that includes negative voltages, ranging between $V_H = 0V$ and $V_L = -3Vd$ (see FIG. 9B) but produces an output voltage range that includes mostly positive voltages, ranging from the positive drain supply rail voltage $V_{DD}$ to the source supply rail voltage $V_{SS}$. The dissimilar input and output voltage ranges make it difficult (and in many cases impossible) for one GaN-HEMT switch-based circuit to directly drive another GaN-HEMT switch-based circuit. However, by employing the driver interface 804 between the output of one GaN-HEMT switch-based circuit and the input of the other GaN-HEMT switch-based circuit the first GaN-HEMT switch-based circuit is provided the ability to indirectly drive the other. FIG. 12 illustrates, for example, how a gate interface 1204 like the gate interface 804 depicted in FIG. 8 is employed in one embodiment of the invention to allow a first GaN-HEMT inverter stage 1202 to indirectly drive a second GaN-HEMT inverter stage 1206. Note that in this application of the driver interface 804, the first GaN-HEMT inverter stage 1202 serves essentially the same function as does the gate driver 802 in the circuit depicted in FIG. 8.

The driver interface 804 can also serve well in situations where the gate driver is an external integrated circuit (IC) chip, such as a silicon-based (Si-based) driver IC that produces output high and low levels $V_{O,H}$ and $V_{O,L}$ not within the acceptable input high-level and input low-level ranges of the switch-based circuit. For example, a Si-MOSFET driver will typically produce output-low and output-high voltage levels $V_{O,L}$ and $V_{O,H}$ that range from zero volts to one or a few volts, yet a depletion mode switch-based circuit (e.g., made from depletion mode GaN-HEMTs) will have an acceptable input voltage that includes (mostly or entirely) negative voltages. By employing a driver interface similar to the driver interface 804 shown in FIG. 8, however, the Si-MOSFET driver is provided the ability to indirectly drive the depletion mode switch-based circuit. For the driver interface to be most effective, the external Si-MOSFET driver should preferably produce a drive signal having a level-to-level voltage swing equal to or greater than $3V_d$. In situations where it does not, the driver interface 1304 shown in FIG. 13 may be alternatively used. In this alternative driver interface 1304, two clamping diodes 1306 and 1308 connected in parallel but with opposing polarity are biased by first and second bias voltages $V_{BIAS1}$ and $V_{BIAS2}$, resulting in a level-shifted drive signal $V_{drive}'$ that is clamped between two levels: $V_{BIAS1}+V_d$ and $V_{BIAS2}-V_d$.

Figure 13:
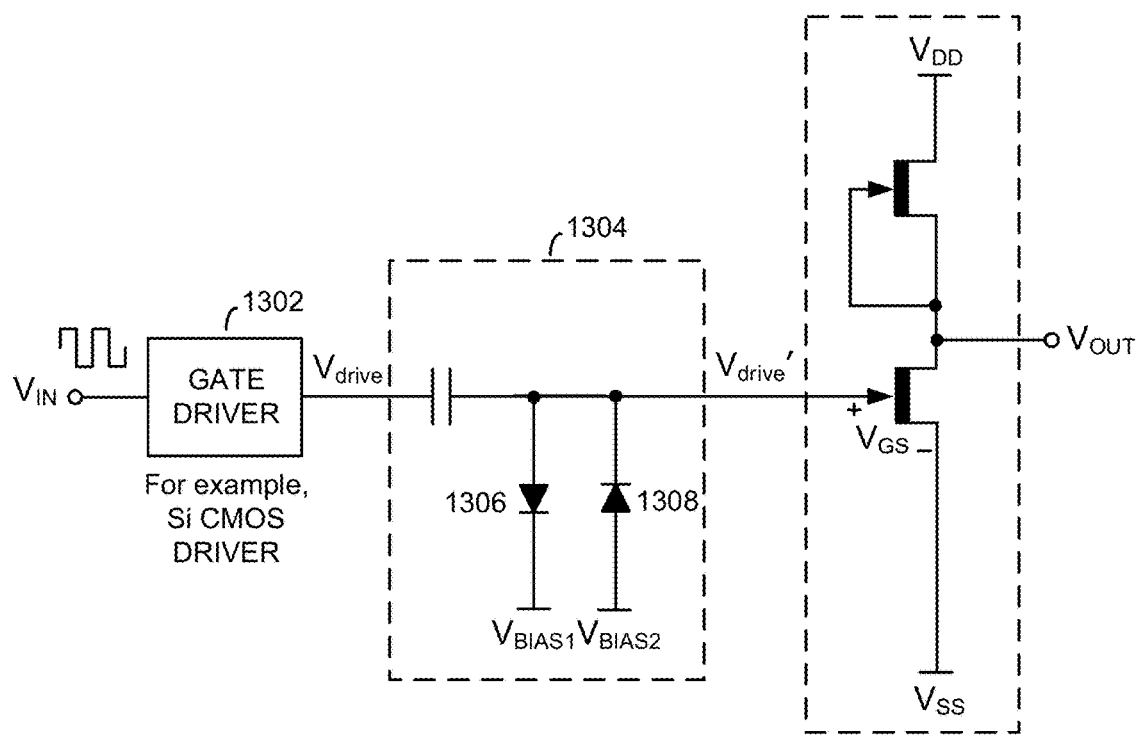
FIG. 13 is a schematic drawing of a circuit that employs a driver interface, according to another embodiment of the invention, which can serve as an interface between a gate driver and a switch-based circuit, and which is particularly well-suited for situations where the drive signal provided by the gate driver has a limited level-to-level voltage swing.
Figure 14:
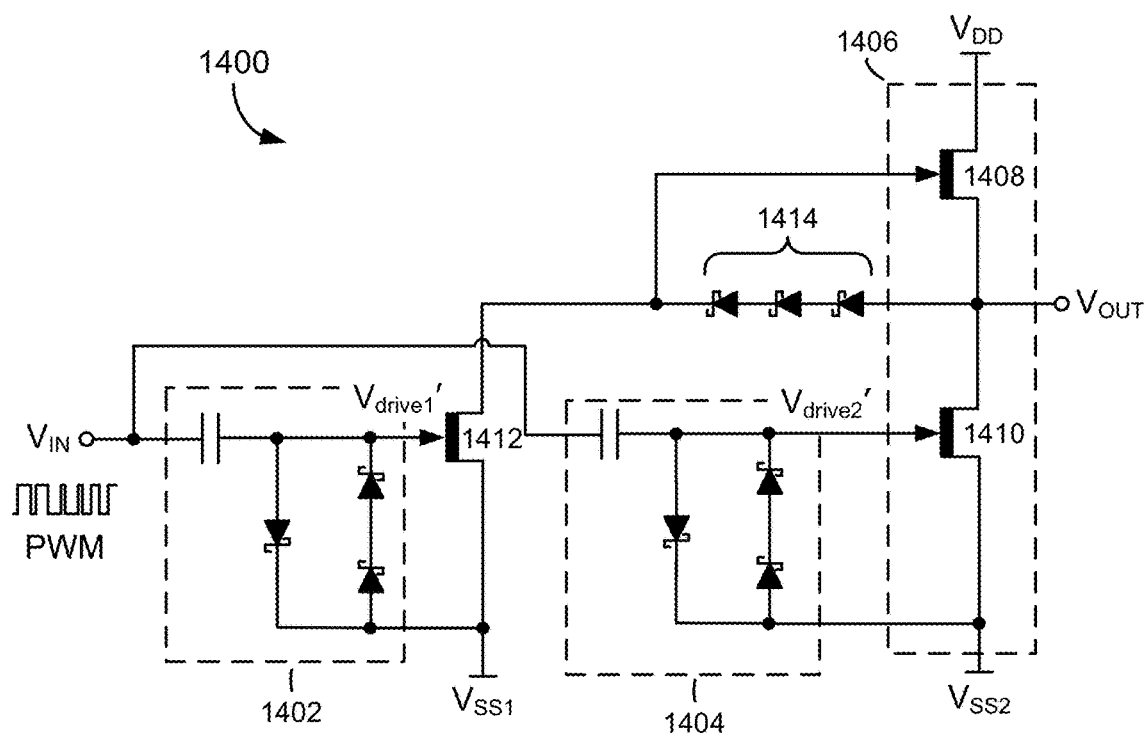
FIG. 14 is a schematic drawing of a synchronous buck converter that utilizes first and second driver interfaces similar to the driver interface depicted in FIG. 8, in accordance with one embodiment of the invention.

The driver interface 804 depicted in FIG. 8 and the alternative driver interface 1304 depicted in FIG. 13 can also be employed as driver interfaces for switch-based circuits that include a half-bridge or a switching stage comprised of high-side and low-side switches, such as are used in synchronous buck converters, Class-S amplifiers, and Class-D amplifiers. (Note that these types of switch-based circuits which contain high-side and low-side FETs are often referred to in the art as a "totem pole" switching stage.) FIG. 14 illustrates, for example, how first and second driver interfaces 1402 and 1404, each identical in construction to the driver interface 804 in FIG. 8, are configured to serve as driver interfaces in a synchronous buck converter 1400, in accordance with one embodiment of the invention. Except for the addition of the first and second driver interfaces 1402 and 1404, which obviate the need for biasing resistors to bias the inputs of depletion mode FETs 1410 and 1412, and the presence of the Schottky diode chain 1414 in the bootstrap path, the synchronous buck converter 1400 has a construction that is substantially similar to the bootstrap Class-D power amplifier described in co-pending and commonly assigned U.S. patent application Ser. No. 14/754,656, which is incorporated herein by reference. Because of these similarities, the circuit in FIG. 14 could alternatively serve a Class-D power amplifier, as will be appreciated by those of skill in the art.

The synchronous buck converter 1400 depicted in FIG. 14 is driven, via the first and second driver interfaces 1402 and 1404, by a single PWM drive signal $V_{IN}$ provided by an external gate driver (not shown). The first and second driver interfaces 1402 and 1404 each have a construction like the driver interface 804 described above in reference to FIG. 8. (Note that if the voltage swing of the input PWM drive signal $V_{IN}$ is less than $3V_d$, driver interfaces modeled after the driver interface 1304 depicted in FIG. 13 can be used to construct the first and second driver interfaces 1402 and 1404, instead.) The first and second driver interfaces 1402 and 1404 also operate in substantially the same manner as described above. Specifically, they: (1) level shift the input PWM signal $V_{IN}$ so that the resulting level-shifted gate drive signals $V_{drive1}'$ and $V_{drive2}'$ each have high and low drive voltages $V_H$ and $V_L$ that are capable of driving the depletion mode FETs 1410 and 1412 between fully ON and fully OFF states, and (2) maintain the high and low drive voltages $V_H$ and $V_L$ of the level-shifted gate drive signals $V_{drive1}'$ and $V_{drive2}'$ they produce at fixed levels regardless of what the duty cycle of the input PWM signal $V_{IN}$ happens to be. With the ability to maintain the high and low drive voltages $V_H$ and $V_L$ at fixed levels, the DC operating points about which the AC components of the level-shifted gate drive signals $V_{drive1}'$ and $V_{drive2}'$ swing also remain constant. Note that in this example of a synchronous buck converter 1400, the duty cycle of the input PWM signal is varied for the purpose of regulating the converter's output voltage. If the circuit in FIG. 14 was employed to serve as a Class-D power amplifier, the duty cycle of the pulse widths and duty cycle of the input PWM signal $V_{IN}$ would be varied to modulate and carry information (e.g., voice or data), rather than to regulate an output voltage.

The high-side and low-side FETs 1408 and 1410 of the half-bridge 1406 are switched synchronously but out of phase, so that when the high-side FET 1408 is switched ON the low-side FET 1410 is switched OFF, and vice versa. Switching the high-side and low-side FETs 1408 and 1410 out of phase minimizes switching losses and allows the half-bridge 1406 to operate with high efficiency. The low-side FET 1410 is switched between its ON and OFF states under the direct control of the level-shifted gate drive signals $V_{drive2}'$ produced at the output of the second driver interface 1404. The high-side FET 1408, on the other hand, is switched between ON and OFF states indirectly, under the coordinated control and operation of the FET 1412 (as driven by the level-shifted gate drive signals $V_{drive1}'$), the low-side FET 1410, and the bootstrapped Schottky diode chain 1414. The source supply voltage $V_{SS1}$ applied to the source of the control FET 1412 has a value that is preferably $3V_d$ or more negative than the source supply voltage $V_{SS2}$ applied to the source of the low-side FET 1410, so that when the level-shifted gate drive signals $V_{drive1}'$ and $V_{drive2}'$ switch the control FET 1412 and the low-side FET 1410 ON the diode chain 1414 is biased into conduction and a gate-source voltage of $V_{GS}(1408)=-3V_d<V_T$ is applied across the gate-source terminals of the high-side FET 1408. Since the high-side and low-side FETs 1408 and 1410 are switched out of phase, the output voltage $V_{OUT}$ produced at the output switching node of the half-bridge 1406 is pulled down to $V_{SS2}$ when the high-side FET 1408 is switched OFF and the low-side-switch 1410 is switched ON. The high-side FET 1408 is switched ON when the level-shifted gate drive signals $V_{drive1}'$ and $V_{drive2}'$ drop down to their low drive levels $V_L$. (Note that the synchronous buck converter 1400 does not require a large charge pump capacitor in order to pull the gate of the high-side FET 1408 above the drain supply voltage $V_{DD}$, in order to turn the high-side FET 1408 ON, as is necessary in most conventional Si-MOSFET-based synchronous buck converters that utilize a n-channel MOSFET for the high-side FET.) Specifically, upon the level-shifted gate drive signals $V_{drive1}'$ and $V_{drive2}'$ dropping down to their low drive levels $V_L$, the FET 1412 switches OFF, almost immediately. The high-side FET 1408 switches ON shortly thereafter, once its input gate capacitor has fully charged. (The high-side and low-side FETs 1408 and 1410 of the half-bridge 1406 will typically have larger gate areas and, consequently, larger input gate capacitances than the control FET 1412, so it will take somewhat longer to switch the high-side and low-side FETs 1408 and 1410 between fully ON and fully OFF states than it will to switch the control FET 1412 between fully ON and fully OFF states.) The high-side FET's 1408's input gate capacitor is charged up by current supplied from the drain power supply $V_{DD}$, via the bootstrapped diode chain 1414. Once the input gate capacitor becomes fully charged, the voltage drop across the diode chain 1414 falls to zero (since no current is then flowing through it). Since the diode chain 1414 is connected across the gate-source terminals of the high-side FET 1408, the gate-source voltage $V_{GS}(1408)$ of the high-side FET 1408 will therefore also fall to near 0V. With $V_{GS}(1408)$ =0V, the high-side FET 1408 is then fully ON. Since the low-side FET 1410 will be switched fully OFF at this time, the output voltage $V_{OUT}$ produced at the output switching node of the half-bridge 1406 is pulled up to the drain supply voltage $V_{DD}$. Switching the high-side and low-side FETs 1408 and 1410 of the half-bridge 1406 as described above thus results in the output voltage $V_{OUT}$ swinging from rail to rail, i.e., between $V_{DD}$ and $V_{SS2}$. The final desired DC output voltage can then be recovered from the switching output voltage $V_{OUT}$ using a low-pass filter (not shown), as will be understood by those of ordinary skill in the art.

In accordance with one embodiment of the invention, the synchronous buck converter 1400 depicted in FIG. 14 is fabricated using a GaN-HEMT fabrication process. Using a GaN-HEMT fabrication process, the Schottky barriers that form at the gate-metal/AlGaN interface during fabrication can be advantageously exploited to implement the diodes in the driver interfaces 1402 and 1404, as well as the diodes that make up the diode chain 1414, similar to as discussed above in reference to FIG. 10. The ability to manufacture most all of the components of the synchronous buck converter 1400 entirely from GaN-HEMTs, along with the fact that GaN-HEMTs have a high power density, allows the synchronous buck converter 1400 to be manufactured in a compact, small-footprint integrated circuit. GaN-HEMTs also have material and electronic properties that allow them to be switched ON and OFF much more rapidly than other types of FETs, such as Si MOSFETs, even when high currents and high voltages are involved. This fast switching, high power capability makes the GaN-HEMT particularly well-suited for the high-side and low-side FETs in the totem pole switching stages of switch-mode power converters and switch-mode power amplifiers.

Another benefit the GaN-HEMT has over the Si MOSFETs is that the GaN-HEMT does not have a parasitic body diode. The parasitic body diode of the Si MOSFET adversely affects the realizable efficiency of a synchronous power converter since when the Si MOSFET serves as the low-side FET in the converter's half-bridge the body diode becomes forward biased during commutation dead times (times when both the low-side Si MOSFET and high-side Si MOSFET are switched off). During each of these dead times a reverse recovery charge accumulates and is stored in the low-side Si MOSFET's body diode. When the high-side MOSFET is switched ON after each dead time, the body diode of the low-side Si MOSFET turns off—but not until the reverse recovery charge has discharged. Since the GaN-HEMT is a majority carrier device and does not have a body diode, power losses relating to the reverse recovery of a parasitic body diode can be entirely avoided.

Figure 15:
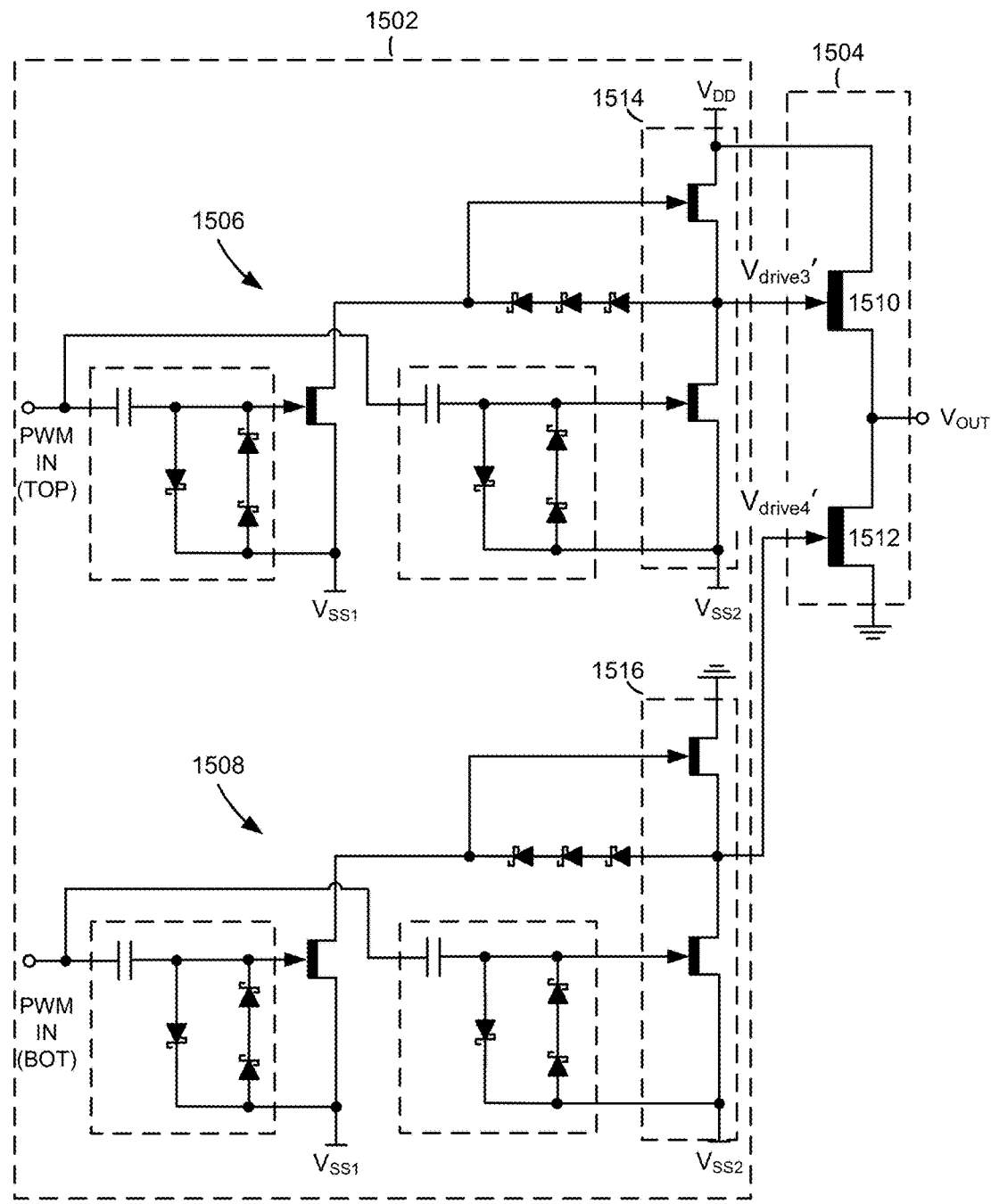
FIG. 15 is a schematic drawing of a synchronous buck converter that includes a high-power half-bridge and a low-power driver interface stage constructed from multiple driver interfaces similar to the driver interface depicted in FIG. 8, in accordance with another embodiment of the invention.

FIG. 15 is a schematic drawing of a synchronous buck converter 1500, according to another embodiment of the invention. The synchronous buck converter 1500 comprises a driver interface stage 1502 and a half-bridge 1504. Like the half-bridge 1406 of the synchronous buck converter 1400 depicted in FIG. 14, the half-bridge 1504 of the synchronous buck converter 1500 can alternatively serve as the switching stage of a Class-D power amplifier. The driver interface stage 1502 comprises two driver interfaces—a first driver interface 1506 configured to serve as an interface to the high-side FET 1510 of the half-bridge 1504 and a second driver interface 1508 configured to serve as an interface to the low-side FET 1512 of the half-bridge 1504. Each of the first and second driver interfaces 1506 and 1508 is constructed like, and operates similar to, the entire synchronous buck converter 1400 depicted in FIG. 14. An important exception is that the output switching stages 1514 and 1516 used in the driver interface stage 1502 are fabricated from FETs of significantly smaller gate areas. In fact, all of the FETs in the driver interface stage 1502 have significantly smaller gate areas than do the high-side and low-side FETs 1510 and 1512 of the half-bridge 1504. One benefit of this approach is that the first and second driver interfaces 1506 and 1508 are independently controllable, which provides flexibility in adjusting the relative timing of the level-shifted drive signals $V_{drive3}'$ and $V_{drive4}'$ for the high-power half-bridge 1504 during design. This flexibility is valuable since it not only allows switching losses in the high-power half-bridge 1504 to be minimized but it also allows commutation dead times to be precisely controlled and any possibility of shoot-through to be avoided. Similar to the other driver interface circuits disclosed herein, the driver interface stage 1502 of the synchronous buck converter 1500 may be manufactured in the same integrated circuit as the half-bridge 1504. Alternatively, it may be manufactured as a separate integrated circuit.

Figure 16:
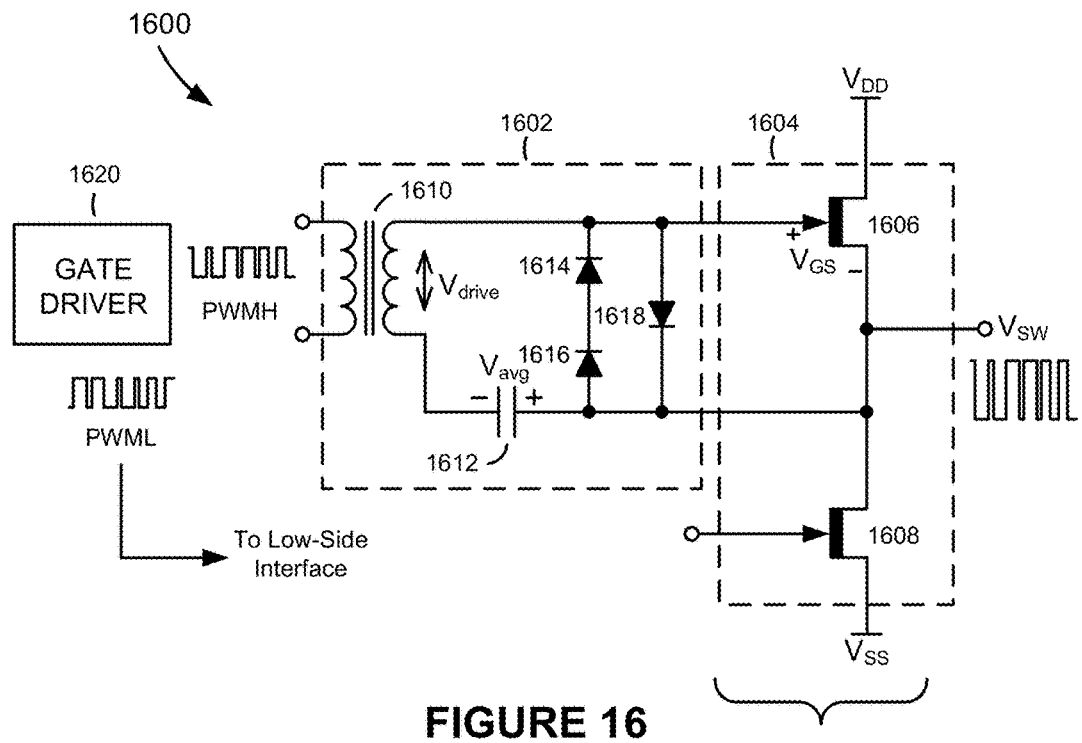
FIG. 16 is a schematic drawing of a circuit that employs a floating driver interface for the high-side FET of the half-bridge of a switch-mode power converter or the high-side FET of the switching stage of a Class-D amplifier, according to another embodiment of the present invention.
Figures 17A, 17B, 17C:
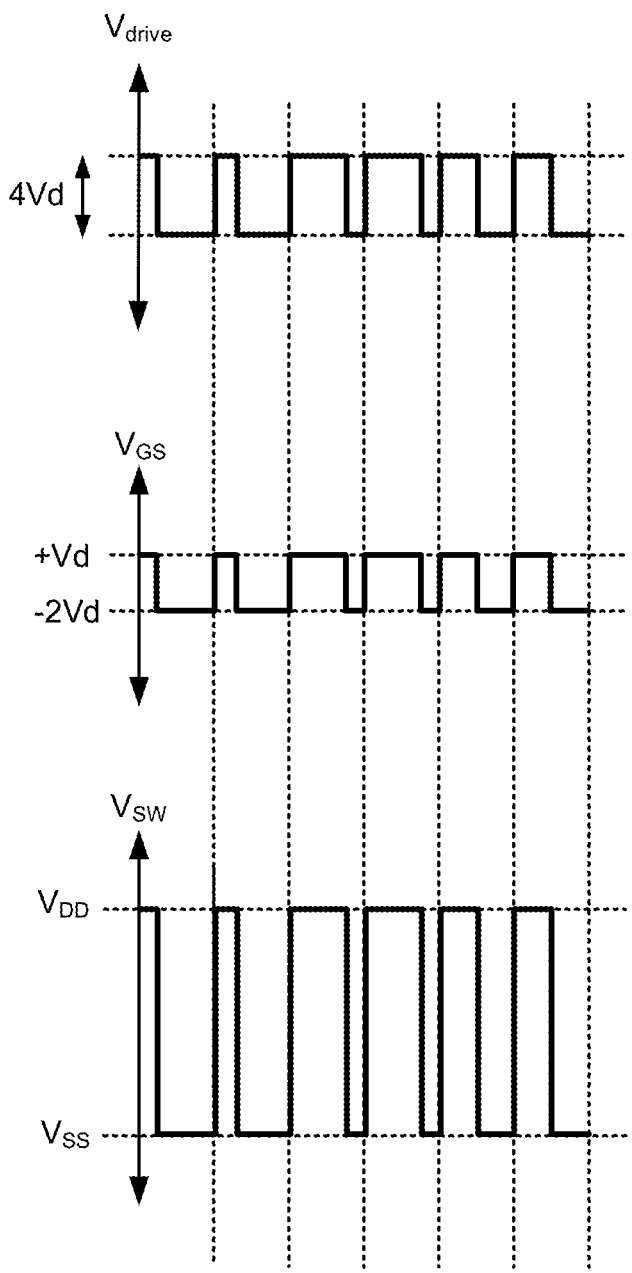
FIG. 17A-C are signal diagrams of the drive signal $V_{drive}$ produced across the secondary winding of the isolation transformer in the floating driver interface depicted in FIG. 16 (FIG. 17A), the gate-source voltage waveform $V_{GS}$ produced by the floating driver interface (FIG. 17B), and the switch node output voltage $V_{SW}$ produced at the output switching node of the half-bridge (FIG. 17C)

FIG. 16 is a schematic drawing illustrating how a driver interface similar to the driver interface 804 depicted in FIG. 8 can be modified to serve as a floating driver interface 1602 for the high-side FET 1606 of a half-bridge 1606 of a synchronous buck converter 1600 (or, alternatively, as an interface for the high-side FET of the switching stage of a Class-D amplifier), in accordance with another embodiment of the invention. The floating driver interface 1602 comprises an isolation transformer 1610, an isolation capacitor 1612, and clamping diodes 1614, 1616 and 1618, and is referred to as a "floating" driver interface here to emphasize the fact that it floats electrically with respect to the output of the half-bridge 1604, meaning that it does not share a ground reference in common with the half-bridge 1604. The floating driver interface 1602 provides a gate driver 1620 the ability to indirectly drive the high-side FET 1606 of the half-bridge 1604 in situations where the gate driver 1620 produces a high-side PWM drive signal PWMH having high and low levels $V_{O,H}$ and $V_{O,L}$ that do not fall within the acceptable input high-level and input low-level ranges of the high-side FET 1606. In providing the gate driver 1620 this capability, the high-side PWM drive signal PWMH is applied across the primary winding of the isolation transformer 1610, which induces a drive signal $V_{drive}$ of the same duty cycle across its secondary winding. Like the driver interface 804 depicted in FIG. 8, the floating driver interface 1602 depicted in FIG. 16 works best if the level-to-level voltage swing of the drive signal $V_{drive}$ is greater than $3V_d$, where, again, $V_d$ is the forward diode voltage drop across one of the clamping diodes 1614, 1616, 1618 when forward biased into conduction. In the example described here, the voltage swing of $V_{drive}$ is $4V_d$, as shown in FIG. 17A.

The drive signal $V_{drive}$ induced across the secondary winding of the isolation transformer 1602 reverses polarity during each cycle, from $+4V_d$ during a first portion of each cycle to $-4V_d$ during the remainder of each cycle. Before the high-side FET 1606 of the half-bridge 1604 can be properly switched between fully ON and fully OFF states, the drive signal $V_{drive}$ must first be level-shifted and, if necessary, the level-to-level voltage swing must be adjusted. Together, the isolation capacitor 1612 and clamping diodes 1614, 1616 and 1618 perform this function. Specifically, during times when the polarity of the drive signal $V_{drive}$ is positive, i.e., is $+4V_d$ (using the lower leg of the secondary winding of the isolation transformer 1620 as a reference), clamping diode 1618 conducts and drops a forward diode voltage drop of $V_d$. This results in the gate-source waveform $V_{GS}$(1606) being clamped to a high drive level of $V_{GS,H}=+V_d$, as illustrated in FIG. 17B. So that Kirchhoff's voltage law (KVL) is satisfied during this time, the isolation capacitor 1612 charges up to the remaining $+3V_d$. During the remainder of the cycle, when the switch drive signal $V_{drive}$ is of the opposing polarity, i.e., $-4V_d$ (again using the lower leg of the isolation transformer 1620 as a reference), clamping diodes 1614 and 1614 conduct, resulting in the gate-source waveform $V_{GS}$ (1606) dropping down to its low drive level $V_{GS,L}=-2V_d$, as shown in FIG. 17B. So that KVL is satisfied during this time, the isolation capacitor 1612 charges up to the remaining $-2V_d$.

The clamping diodes 1614, 1616 and 1618 of the high-side driver interface 1602 may be formed using any suitable diode technology. In one embodiment of the invention they are formed from the Schottky barriers provided by the gate-metal/AlGaN junctions of GaN-HEMTs manufactured in a GaN-HEMT fabrication process, specifically, by shorting the drain and source of each Schottky diode/GaN-HEMT as described above in reference to FIG. 10. In one GaN-HEMT fabrication process used to manufacture the driver interface 1602 and half-bridge 1604, the Schottky clamping diodes 1614, 1616 and 1618 have a forward voltage drop of $V_d \approx 1V$ and the GaN-HEMTs of the half-bridge 1604 have a threshold voltage of $V_T \approx -1.8V$. Clamping $V_{GS,H}$ to $+V_d=1V$ is therefore more than sufficient to switch the high-side FET 1606 fully ON, and clamping $V_{GS,L}$ to $-2V_d=-2V<V_T \approx -1.8V$ is more than sufficient to switch the high-side FET 1606 fully OFF. In situations where the two forward diode voltage drops $2V_d$ provided by the clamping diodes 1614 and 1616 is insufficient to clamp $V_{GS,L}$ below $V_T$, one or more additional diodes can be connected in series with the clamping diodes 1614 and 1616, as will be appreciated by those of ordinary skill in the art. Similarly, if $V_{GS,H}=+V_d$ is insufficient to turn the high-side FET 1606 fully ON one or more clamping diodes can be connected in series with the clamping diode 1618. Since a $V_{GS,H}>0V$ will be sufficient to turn the GaN-HEMTs fully ON in most any case, the single clamping diode 1618 will likely be sufficient for most any situation.

Like the high-side and low-side FETs in any half-bridge, the high-side FET 1606 and low-side FET 1608 of the half-bridge 1604 in the circuit in FIG. 16 are controlled so that they are switched synchronously but out of phase. Accordingly, as illustrated in FIG. 17C, when the high-side FET 1606 is switched OFF and the low-side FET 1608 is switched ON the switch node output voltage $V_{SW}$ of the GaN-HEMT half-bridge 1604 is pulled down to $V_{SS}$, and when the high-side FET 1606 is switched ON and the low-side FET 1608 is switched OFF the switch node output voltage $V_{SW}$ is pulled up to $V_{DD}$. To recover the final desired DC output voltage, the switch node output voltage $V_{SW}$ can be filtered by a low-pass filter (not shown in FIG. 16), as will be appreciated and understood by those of ordinary skill in the art.

Figure 18:
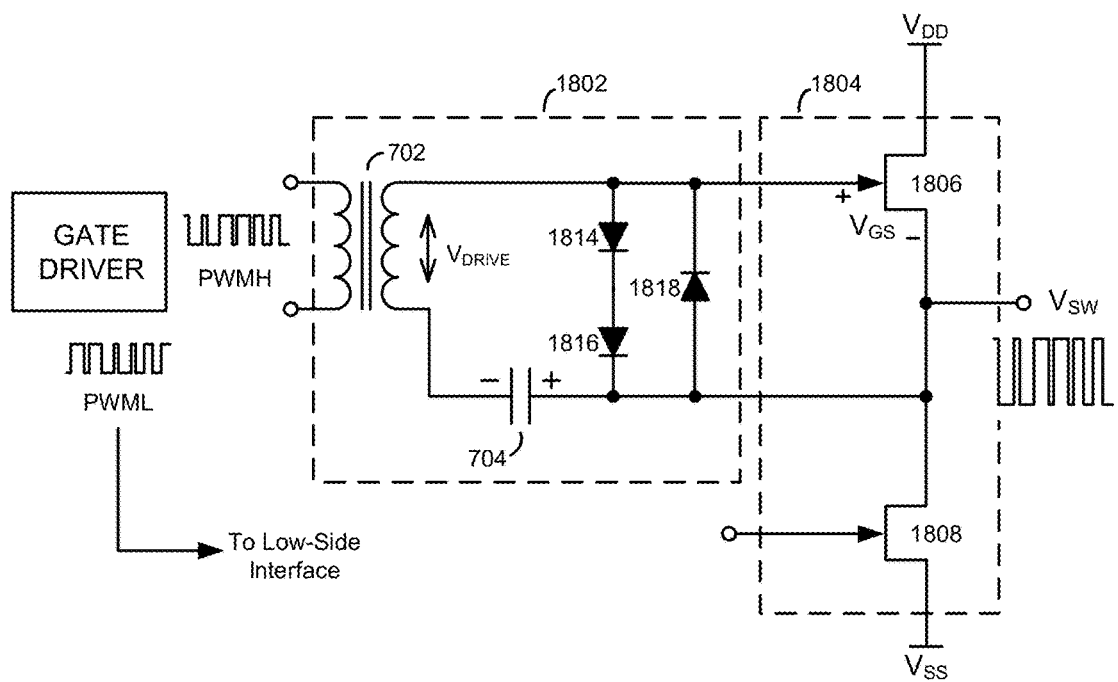
FIG. 18 is a schematic drawing of a circuit that employs a floating driver interface similar to that depicted in FIG. 16 but which has been modified to drive an n-channel, enhancement high-side FET (e.g., an n-channel, enhancement mode GaN-HEMT) in a switch-mode power converter or in the switching stage of a Class-D amplifier, in accordance with another embodiment of the present invention.

The floating driver interface 1600 depicted in FIG. 16 is designed to serve as a driver interface for a half-bridge constructed from depletion mode FETs (as in FIG. 16), and preferably from depletion mode GaN-HEMTs. Recently, it has been shown to be possible to manufacture n-channel enhancement mode GaN-HEMTs. An n-channel enhancement mode GaN-HEMT is a "normally off" FET, requiring application of a positive gate-source voltage higher than its positive threshold voltage $V_T$ in order to turn it ON. When configured to serve as the high-side switch in a half-bridge, if the driver and half-bridge share the same ground reference, the gate voltage of the n-channel enhancement mode GaN-HEMT must be raised higher than the power supply voltage $V_{DD}$ in order to switch the n-channel enhancement mode GaN-HEMT fully ON. Unfortunately, because the power supply voltage $V_{DD}$ is usually the highest available voltage in the circuit, switching the n-channel enhancement mode GaN-HEMT ON is problematic. Fortunately, this problem can be circumvented by employing a floating driver interface similar to the floating driver interface 1602 depicted in FIG. 16 but modified so that it is capable of driving the enhancement mode high-side GaN-HEMT instead of the depletion mode GaN-HEMT. The only modification needed is the reversing of the directions of the clamping diodes 1814, 1816 and 1818, as illustrated in FIG. 18. The clamping diodes 1814 and 1816 clamp the high drive level $V_{GS,H}$ of the gate-source voltage waveform $V_{GS}$(1806) to $2V_d$ (i.e., $V_{GS,H}=+2V_d$), providing the ability to switch the high-side enhancement mode GaN-HEMT 1806 ON (assuming the $V_{GS,H}=+2V_d>V_T$), and the clamping diode 1818 clamps the low drive level $V_{GS,L}$ to $-V_d$ (i.e., $V_{GS,L}=-V_d$), providing the ability to turn the high-side enhancement mode GaN-HEMT 1806 OFF. Because the modified floating driver interface 1802 floats with respect to the output of the enhancement mode GaN-HEMT half-bridge 1804, the high drive level $V_{GS,H}$ of the gate-source waveform $V_{GS}$(1806) can be independently raised to a level sufficient to turn the high-side FET fully ON, without having to use a charge pump or boost converter, as is usually the case in prior art high-side FET drivers.

Figure 6:
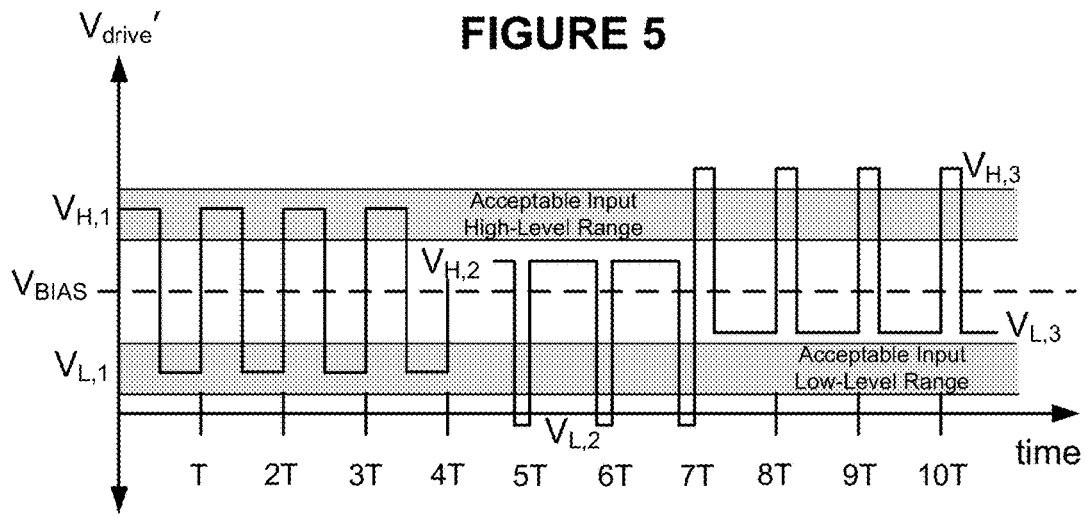
FIG. 6 is a signal diagram of a level-shifted PWM drive signal that has been level shifted by the conventional level-shifting approach depicted in FIG. 3, highlighting how the high and low drive levels $V_H$ and $V_L$ of the resulting level-shifted PWM signal do not always fall within the acceptable input high-level and input low-level ranges of the switch-based circuit being driven.
Figure 7:
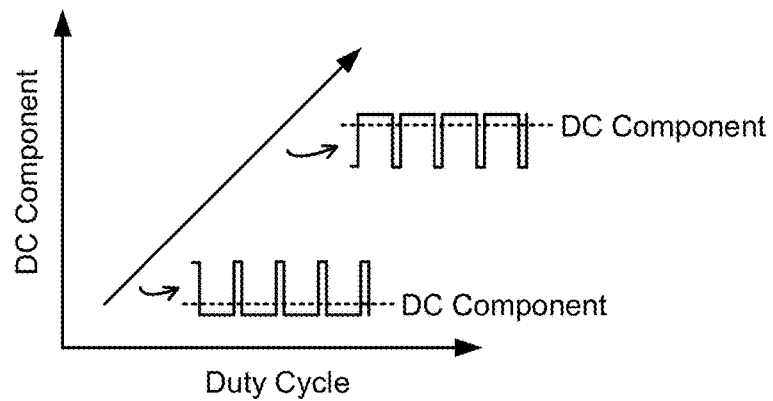
FIG. 7 is a graph that illustrates how the DC component of a PWM waveform increases as the duty cycle of the PWM waveform increases.

From the foregoing description it should be clear that one of the main advantages the driver interfaces of the present invention have over the conventional level-shifting approach described above in reference to FIG. 3 is that the high and low drive levels $V_H$ and $V_L$ of the level-shifted drive waveforms produced by the interfaces remain constant over time, irrespective of the duty cycle of the input gate drive signal provided by the gate driver. (Compare FIG. 9B to FIG. 6.) In the various embodiments of the invention described above, this attribute was described in the context of input gate drive signals that are periodic and have PWM waveforms. While the driver interfaces of the present invention serve well when PWM waveforms are involved, they can also be advantageously used in applications that involve drive waveforms that are aperiodic, semi-periodic, or which even have a variable periodicity. For example, they can be employed equally well in applications in which the driver signals are pulse-density modulated (PDM). Unlike in PWM where the widths of pulses in the drive signal are varied to regulate a voltage or encode information, in PDM the pulses in the waveform are maintained at fixed durations but the density of the pulses is varied over time to regulate a voltage or to encode and convey information.

Figure 19:
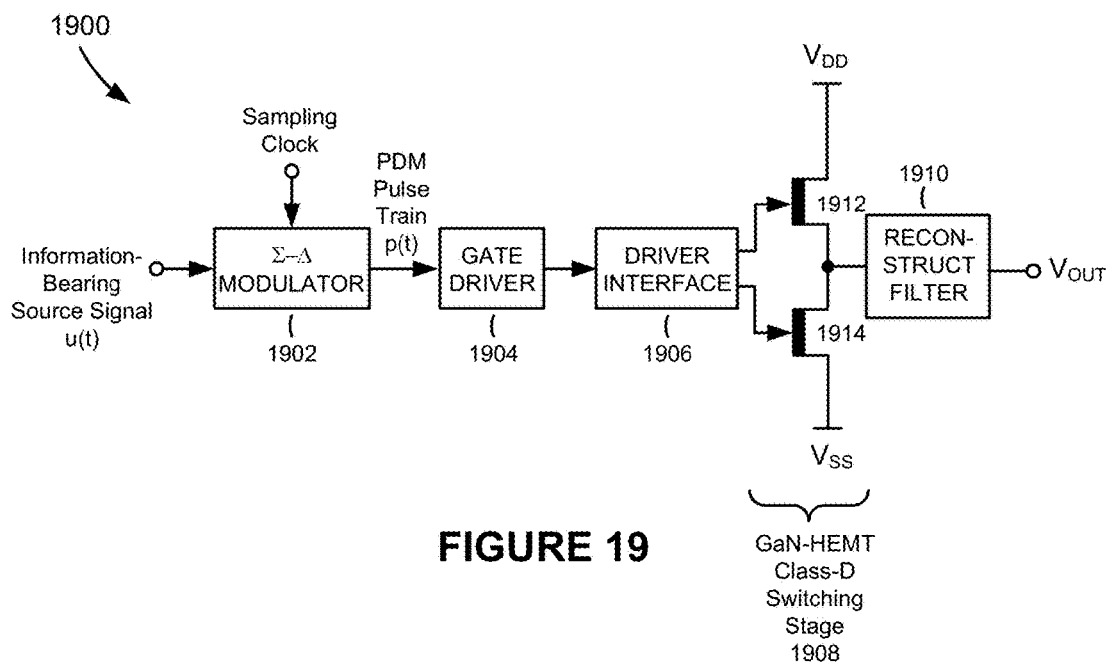
FIG. 19 is a schematic drawing of a Class-D power amplifier that employs one of the driver interfaces of the present invention to interface a pulse-density modulation (PDM) gate drive signal to the amplifier's switching stage, according to another embodiment of the present invention.

FIG. 19 is a schematic drawing of a Class-D power amplifier (RFPA) 1900, illustrating how one of the driver interfaces described above can be used to interface a PDM gate drive signal to the amplifier's switching stage. The Class-D RFPA 1900 comprises a Σ-Δ modulator 1902, a gate driver stage 1904, a driver interface stage 1906, an output switching stage 1908, and a reconstruction filter 1910. The Σ-Δ modulator 1902 comprises a source encoder that encodes an information-bearing source signal u(t) into an information-bearing PDM pulse train p(t). From the PDM pulse train p(t) the gate driver stage 1904 produces gate drive signals for driving the large-gate power FETs of the output switching stage 1908. Similar to as described above in other embodiments of the invention, the driver interface stage 1906 is employed to level shift the gate drive signals produced by the gate driver stage 1904 so that the high-side and low-side depletion mode FETs 1912 and 1914 of the output switching stage 1908 can be properly driven between fully ON and fully OFF states. The driver interface stage 1906 may be constructed using any of the various driver interfaces described above. For example, in one embodiment of the invention, the driver interface stage 1502 depicted in FIG. 15 is used. The high-side and low-side depletion mode FETs 1912 and 1914 of the output stage 1908 are preferably implemented using GaN-HEMTs. Exploiting the high-power, high-frequency capabilities of the GaN-HEMT, the Class-D power amplifier 1900 can even serve as a radio frequency power amplifier (RFPA), for example, as an RFPA in a wireless handset or other wireless transmitter, in which case the information-bearing source signal u(t), PDM pulse train p(t), and drive signal would all be RF signals. To recover the final, desired modulated output waveform $V_{OUT}$, the reconstruction filter 1910 is used to filter the high-power PDM signal produced at the output switching node of the output switching stage 1908.

While various embodiments of the present invention have been presented, they have been presented by way of example and not limitation. It will be apparent to persons skilled in the relevant art that various changes in form and detail may be made to the exemplary embodiments without departing from the true spirit and scope of the invention. Accordingly, the scope of the invention should not be limited by the specifics of the exemplary embodiments of the invention but, instead, should be determined by the appended claims, including the full scope of equivalents to which such claims are entitled.

What is claimed is:

1. A switching apparatus, comprising:
a high-side depletion mode FET having a gate, a drain configured to be coupled to a drain power supply voltage, and a source;
a low-side depletion mode FET having a gate, a drain connected to the source of the high-side depletion mode FET at a switching node, and a source configured to be coupled to a first source power supply voltage;
a bootstrap path formed between the switching node and the gate of the high-side depletion mode FET, the bootstrap path including a string of one or more diodes having an anode connected to the switching node and a cathode connected to the gate of the high-side depletion mode FET and through which an input gate capacitor of the high-side depletion mode FET can charge to switch the high-side depletion mode FET ON;
a control FET configured to provide a discharge path through which charge stored on the input gate capacitor of the high-side depletion mode FET can discharge to switch the high-side depletion mode FET OFF, the control FET having a gate, a drain coupled to the gate of the high-side depletion mode FET, and a source configured to be coupled to a second source power supply voltage more negative than the first source power supply voltage by at least one threshold voltage of the high-side depletion mode FET;
a first driver interface configured to receive an input drive signal and produce a first level-shifted drive signal having high and low drive levels capable of switching the control FET between fully ON and fully OFF states; and
a second driver interface configured to receive the input drive signal and produce a second level-shifted drive signal having high and low drive levels capable of switching the low-side depletion mode FET between fully ON and fully OFF states,
wherein the string of one or more diodes in the bootstrap path have a combined forward voltage drop sufficient to maintain the gate-to-source voltage of the high-side depletion mode FET at a value more negative than the threshold voltage of the high-side depletion mode FET during times when the control FET is switched ON and the input gate capacitor of the high-side depletion mode FET is discharging.

2. The switching apparatus of claim 1, wherein the first driver interface comprises:
a first diode or a first series of diodes configured to clamp a high level of the level-shifted drive signal so that a high level of a gate-source voltage waveform applied across the gate-source terminals of the control FET is greater than a threshold voltage of the control FET; and
a second diode or a second series of diodes connected in parallel with the first diode or the first series of diodes but with an opposing polarity configured to clamp a low level of the level-shifted drive signal so that a low level of the gate-source voltage waveform applied across the gate-source terminals of the control FET is less than the threshold voltage of the control FET.

3. The switching apparatus of claim 2, wherein the first driver interface further comprises a DC blocking capacitor configured to remove a DC voltage from the input drive signal.

4. The switching apparatus of claim 1, wherein the input drive signal has a duty cycle or pulse density that varies over time, the first driver interface serves to maintain high and low levels of a first gate-source voltage waveform applied across the gate-source terminals of the control FET at substantially fixed voltage levels regardless of what the duty cycle or pulse density of the input drive signal happens to be, and the second driver interface serves to maintain high and low levels of a second gate-source voltage waveform applied across the gate-source terminals of the low-side FET at substantially fixed voltage levels regardless of what the duty cycle or pulse density of the input drive signal happens to be.

5. The switching apparatus of claim 1, wherein the input drive signal is provided by a silicon (Si) metal-oxide-semiconductor FET (Si-MOSFET) driver, and the control FET, high-side FET and low-side FET are all depletion mode gallium nitride high electron mobility transistors (GaN-HEMTs).

\* \* \* \* \*